(12) United States Patent
Suzuki et al.

(10) Patent No.: US 12,132,063 B2
(45) Date of Patent: Oct. 29, 2024

(54) SEMICONDUCTOR PACKAGE AND METHOD FOR MANUFACTURING SEMICONDUCTOR PACKAGE

(71) Applicant: SONY SEMICONDUCTOR SOLUTIONS CORPORATION, Kanagawa (JP)

(72) Inventors: Masami Suzuki, Kanagawa (JP); Daisuke Chino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 402 days.

(21) Appl. No.: 17/612,711

(22) PCT Filed: Apr. 8, 2020

(86) PCT No.: PCT/JP2020/015779
§ 371 (c)(1),
(2) Date: Nov. 19, 2021

(87) PCT Pub. No.: WO2020/241068
PCT Pub. Date: Dec. 3, 2020

(65) Prior Publication Data
US 2022/0271068 A1  Aug. 25, 2022

(30) Foreign Application Priority Data

May 30, 2019  (JP) ................ 2019-100901

(51) Int. Cl.
*H01L 27/146* (2006.01)
(52) U.S. Cl.
CPC .... *H01L 27/1462* (2013.01); *H01L 27/14632* (2013.01); *H01L 27/14636* (2013.01);
(Continued)

(58) Field of Classification Search
CPC .......... H01L 27/1462; H01L 27/14632; H01L 27/14636; H01L 27/14687; H01L 27/1464;
(Continued)

(56) References Cited

U.S. PATENT DOCUMENTS

| 2013/0256819 | A1* | 10/2013 | Watanabe | ............... H01L 24/34 257/422 |
| 2016/0079515 | A1 | 3/2016 | Goto et al. | |
| 2019/0098237 | A1 | 3/2019 | Tsukada et al. | |

FOREIGN PATENT DOCUMENTS

| CN | 105990516 A | 10/2016 |
| CN | 108352389 A | 7/2018 |

(Continued)

OTHER PUBLICATIONS

International Search Report and Written Opinion of PCT Application No. PCT/JP2020/015779, issued on Jun. 23, 2020, 11 pages of ISRWO.

*Primary Examiner* — Karen Kusumakar
(74) *Attorney, Agent, or Firm* — CHIP LAW GROUP

(57) ABSTRACT

Electromagnetic noise is inhibited in a semiconductor package provided with rewiring.
The semiconductor package includes a semiconductor integrated circuit, wiring, and a ferromagnetic material. In addition, in the semiconductor package including the semiconductor integrated circuit, the wiring, and the ferromagnetic material, the wiring connects the semiconductor integrated circuit to a predetermined external terminal. Further, in the semiconductor package including the semiconductor integrated circuit, the wiring, and the ferromagnetic material, the ferromagnetic material is provided between the wiring and the semiconductor integrated circuit.

9 Claims, 15 Drawing Sheets

(52) U.S. Cl.
CPC .... *H01L 27/14687* (2013.01); *H01L 27/1464* (2013.01); *H01L 27/14645* (2013.01)

(58) Field of Classification Search
CPC ... H01L 27/14645; H01L 23/00; H01L 23/02; H01L 23/12; H01L 23/14; H01L 27/146
See application file for complete search history.

(56) References Cited

FOREIGN PATENT DOCUMENTS

| | | |
|---|---|---|
| JP | 2009-158863 A | 7/2009 |
| JP | 2013-118206 A | 6/2013 |
| JP | 2013-207059 A | 10/2013 |
| JP | 2015-119133 A | 6/2015 |
| JP | 2016-063015 A | 4/2016 |
| JP | 2017-183629 A | 10/2017 |
| WO | 2017/081840 A1 | 5/2017 |

\* cited by examiner

SEMICONDUCTOR PACKAGE AND METHOD FOR MANUFACTURING SEMICONDUCTOR PACKAGE

CROSS REFERENCE TO RELATED APPLICATIONS

This application is a U.S. National Phase of International Patent Application No. PCT/JP2020/015779 filed on Apr. 8, 2020, which claims priority benefit of Japanese Patent Application No. JP 2019-100901 filed in the Japan Patent Office on May 30, 2019. Each of the above-referenced applications is hereby incorporated herein by reference in its entirety.

TECHNICAL FIELD

The present technique relates to a semiconductor package. More specifically, the present technique relates to a semiconductor package that performs packaging at a wafer level and a method for manufacturing the semiconductor package.

BACKGROUND ART

Conventionally, semiconductor packages in which a semiconductor integrated circuit is mounted on a substrate and sealed have been used for the purpose of facilitating handling of the semiconductor integrated circuit. There are various types of semiconductor packages, and among them, a wafer level chip size package (WL-CSP) is attracting attention because it can be mounted at a high density. This wafer level package is a semiconductor package in which processes from rewiring and forming electrodes to dicing are performed through a wafer level process. For example, a wafer level package having a structure in which a solid-state imaging element is formed on one surface of a semiconductor substrate, rewiring is then formed on the other surface, and the solid-state imaging element is electrically connected to solder balls by the rewiring has been proposed (see, for example, PTL 1).

CITATION LIST

Patent Literature

[PTL 1]
JP 2009-158863A

SUMMARY

Technical Problem

In the above-mentioned wafer level package, processes up to dicing are performed at a wafer level, thereby achieving reduction in thickness and size of the package. However, when the rewiring transmits a signal, a magnetic field is generated around the rewiring, and a change in the magnetic field may cause electromagnetic noise in the solid-state imaging element. When the electromagnetic noise is generated, there is a problem that image quality of image data is deteriorated due to the electromagnetic noise.

The present technique has been devised in view of such circumstances and an object thereof is to inhibit electromagnetic noise in a semiconductor package provided with rewiring.

Solution to Problem

The present technique has been made to solve the above-mentioned problems, and a first aspect thereof is a semiconductor package including: a semiconductor integrated circuit; wiring that connects the semiconductor integrated circuit to a predetermined external terminal; and a ferromagnetic material provided between the wiring and the semiconductor integrated circuit. This causes the effect of blocking a magnetic field due to the ferromagnetic material.

Also, in the first aspect, the semiconductor integrated circuit may be formed on one of a pair of substrates joined together, and the ferromagnetic material and the wiring may be formed on the other of the pair of substrates. This causes the effect of blocking the magnetic field due to the ferromagnetic material provided on the substrate.

Also, in the first aspect, the wiring may be formed on a surface opposite to a joining surface out of both surfaces of the pair of substrates on the other side. This causes the effect of blocking the magnetic field due to the ferromagnetic material in the semiconductor package manufactured through a wafer level process.

Also, in the first aspect, the semiconductor integrated circuit may be a solid-state imaging element. This causes the effect of improving image quality of image data.

Also, in the first aspect, the ferromagnetic material may be permalloy. This causes the effect of blocking the magnetic field with permalloy.

Also, in the first aspect, a thickness of the ferromagnetic material may be 18 to 25 micrometers. This causes the effect of blocking the magnetic field due to the ferromagnetic material with a thickness of 18 to 25 micrometers.

Also, a second aspect of the present technique is a method for manufacturing a semiconductor package including: a ferromagnetic material forming procedure configured to form a ferromagnetic material on one of a pair of substrates; a circuit forming procedure configured to form a semiconductor integrated circuit on the other of the pair of substrates; a wiring procedure configured to form wiring connected to the semiconductor integrated circuit on a surface of the ferromagnetic material; and an external terminal forming procedure configured to form a predetermined external terminal connected to the wiring. This causes the effect of manufacturing the semiconductor package in which the ferromagnetic material is provided between the wiring and the semiconductor integrated circuit.

Also, the second aspect may further include a joining procedure configured to join the pair of substrates after the ferromagnetic material and the semiconductor integrated circuit are formed This causes the effect of joining the pair of substrates at room temperature.

Also, in the second aspect, in the ferromagnetic material forming procedure, the ferromagnetic material may be formed on the one after the pair of substrates are joined, and in the circuit forming procedure, the semiconductor integrated circuit may be formed on the other after the pair of substrates are joined. This causes the effect of joining the pair of substrates by joining other than room temperature joining.

Also, in the second aspect, the ferromagnetic material forming procedure, the circuit forming procedure, the wiring procedure, and the external terminal forming procedure may be executed through a wafer level process. This causes the effect of manufacturing the semiconductor package through a wafer level process.

DESCRIPTION OF EMBODIMENTS

Hereinafter, aspects for carrying out the present technique (hereinafter referred to as embodiments) will be described. The description will be made in the following order.
1. First embodiment (example in which ferromagnetic material is provided between solid-state imaging element and rewiring)
2. Second embodiment (example in which ferromagnetic material is provided between solid-state imaging element and rewiring after wafers are joined)
3. Application example to moving body

1. FIRST EMBODIMENT

Configuration Example of Wafer Level Package

Figure 1A:
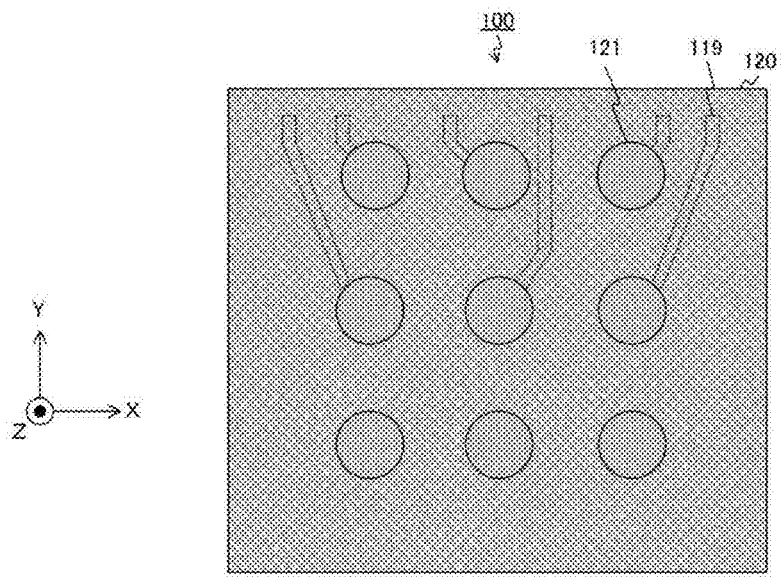
FIGS. 1A and 1B are examples of a plan view and a cross-sectional view of a wafer level package according to a first embodiment of the present technique.
Figure 1B:
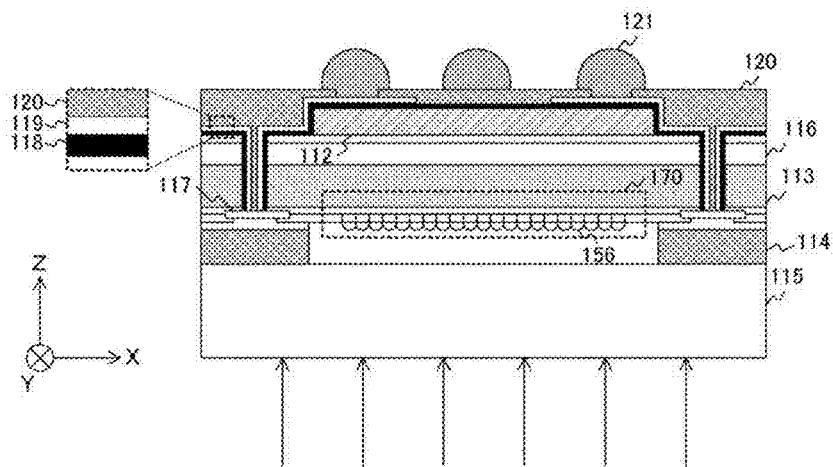

FIGS. 1A and 1B are examples of a plan view and a cross-sectional view of a wafer level package 100 according to a first embodiment of the present technique. FIG. 1A is an example of a cross-sectional view of the wafer level package 100, and FIG. 1B is an example of a plan view of the wafer level package 100.

As illustrated in FIG. 1A, the wafer level package 100 is rectangular, one of both surfaces thereof is covered with a solder mask 120, and a plurality of solder balls 121 are arranged. These solder balls 121 are used as external terminals for electrically connecting a circuit outside the wafer level package 100 to a circuit inside the wafer level package 100. Also, for convenience of description, only nine solder balls 121 are disposed, but in reality, a larger number thereof are disposed Hereinafter, a predetermined direction parallel to a surface of the wafer level package 100 is defined as an "X direction," and a direction perpendicular to the surface is defined as a "Z direction." Also, a direction perpendicular to the X direction and the Z direction is defined as a "Y direction."

for example, FIG. 1B is a cross-sectional view seen in the Y direction. Also, arrow in FIG. 1B indicates an direction of incidence of light. As illustrated in FIG. 1B, a glass 115 is disposed on one surface of the wafer level package 100, and light is incident on the glass 115 in the Z direction. This surface of incidence of light is hereinafter referred to as a "light receiving surface." Further, the solder mask 120 and the solder balls 121 described above are disposed on a surface of the wafer level package 100 opposite to the light receiving surface When a direction toward the light receiving surface is referred to as a downward direction, a silicon substrate 113 is provided above the glass 115, and a lower surface of a silicon substrate 116 is joined to an upper surface of the silicon substrate 113. A solid-state imaging element 170 is provided on the lower surface of the silicon substrate 113 (that is, the surface on the light receiving surface side). Further, a space between a region around the solid-state imaging element 170 on the lower surface of the silicon substrate 113 and the glass 115 is filled with a spacer resin 114.

The solid-state imaging element 170 generates image data through photoelectric conversion. For the solid-state imaging element 170, for example, a back side illumination type CMOS image sensor (CIS) is used. The solid-state imaging element 170 is provided with an optical film layer 156. The optical film layer 156 transmits visible light such as red (R), green (G), and blue (B) and is configured of a color filter and a microlens.

Further, a plurality of through holes penetrating the silicon substrates 113 and 116 are formed therein, and external connection wiring 117 is wired between the through holes and the solid-state imaging element 170. In addition, an insulating film 118 is formed inside the through holes. Rewiring 119 is formed inside the insulating film 118, and the rewiring 119 and the external connection wiring 117 are connected to each other.

A ferromagnetic material 112 is disposed in a region of an upper surface of the silicon substrate 116 located above the solid-state imaging element 170. For the ferromagnetic material 112, for example, permalloy is used. Also, a thickness of the ferromagnetic material 112 in the Z direction is preferably about 18 to 25 micrometers (μm).

Also, for the ferromagnetic material 112, a magnetic material other than permalloy, such as pure iron, silicon steel, and amorphous can also be used.

The insulating film 118 is formed on a region around the ferromagnetic material 112 on the upper surface of the silicon substrate 116 and a surface of the ferromagnetic material 112. The rewiring 119 is formed on a surface of the insulating film 118. The rewiring 119 is connected to the external connection wiring 117.

With the above configuration, the solid-state imaging element 170 and the solder balls 121 are electrically connected to each other by the rewiring 119 and the external connection wiring 117. Further, the ferromagnetic material 112 is disposed between the solid-state imaging element 170 and the rewiring 119. The solid-state imaging element 170 is formed on the silicon substrate 113 of the joined silicon substrates 113 and 116, and the rewiring 119 and the ferromagnetic material 112 are formed on the silicon substrate 116. The rewiring 119 is formed on a surface opposite to the joining surface (lower surface) out of both surfaces of the silicon substrate 116.

Also, although the solid-state imaging element 170 is disposed in the wafer level package 100, the configuration is not limited thereto. Semiconductor integrated circuits other than the solid-state imaging element 170, such as a time of flight (ToF) sensor and a Global Positioning System (GPS) sensor, can also be disposed.

Further, the wafer level package 100 is an example of a semiconductor package described in the claims. The silicon substrates 113 and 116 are an example of a pair of substrates described in the claims. The solder balls 121 are an example of an external terminal described in the claims. The solid-state imaging element 170 is an example of a semiconductor integrated circuit described in the claims, and the rewiring 119 is an example of wiring described in the claims.

Here, in order to explain the effect of disposing the ferromagnetic material 112, a wafer level package having a configuration in which the ferromagnetic material 112 is not provided can be considered as a comparative example.

Figure 2:
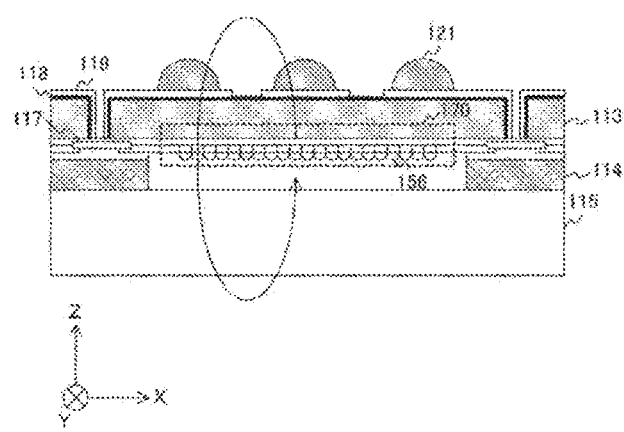
FIG. 2 is an example of a cross-sectional view of a wafer level package according to a comparative example.

FIG. 2 is an example of a cross-sectional view of the wafer level package according to the comparative example. As illustrated in the figure, the ferromagnetic material 112 is not disposed in the comparative example. Further, the silicon substrate 116 is not joined to the silicon substrate 113, and the rewiring 119 is formed on the upper surface of the silicon substrate 113.

In such a comparative example, a magnetic field may be generated around the rewiring 119 when the rewiring 119 transmits a signal, and electromagnetic noise may be generated in the solid-state imaging element 170 due to a change in the magnetic field. When the electromagnetic noise is generated, image quality of image data deteriorates. The curve with the arrow in the figure shows magnetic flux in the magnetic field.

On the other hand, in the configuration in which the ferromagnetic material 112 is disposed between the solid-state imaging element 170 and the rewiring 119 as illustrated in FIGS. 1A and 1B, the ferromagnetic material 112 functions as a magnetic shield that blocks the magnetic field generated around the rewiring 119. For this reason, the electromagnetic noise originating from the rewiring 119 can be inhibited. Accordingly, the image quality of the image data can be improved as compared with the comparative example Next, a method for manufacturing the wafer level package 100 will be described. The wafer level package 100 is manufactured, for example, using a manufacturing method including a procedure of bonding and joining a pair of wafers. One of these wafers is hereinafter referred to as a "magnetic material wafer," and the other is referred to as an "image sensor wafer."

Configuration Example of Magnetic Material Wafer

Figure 3A:
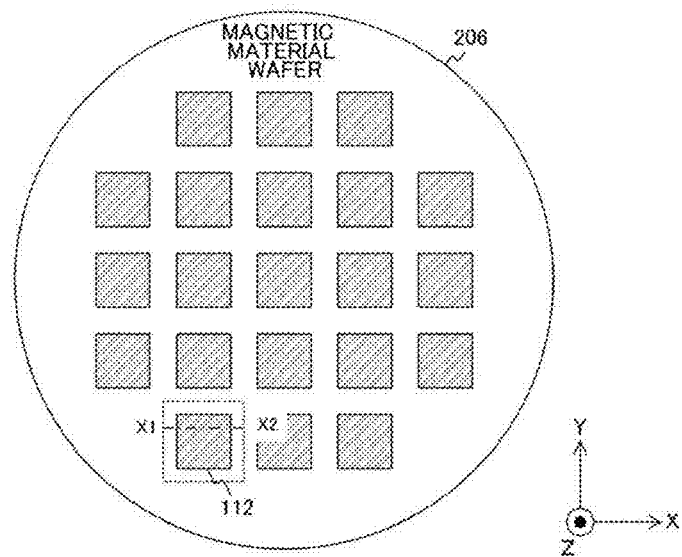
FIGS. 3A and 3B are examples of a plan view and a cross-sectional view of a magnetic material wafer according to the first embodiment of the present technique.
Figure 3B:
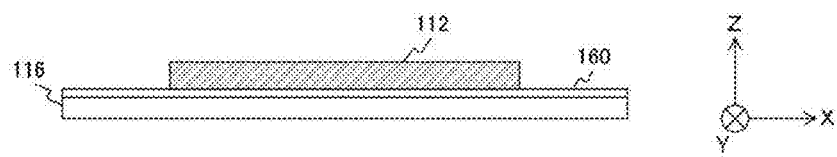

FIGS. 3A and 3B are examples of a plan view and a cross-sectional view of a magnetic material wafer 206 according to the first embodiment of the present technique.

FIG. 3A is a plan view of the magnetic material wafer 206, and FIG. 3B is a cross-sectional view of the magnetic material wafer 206.

As illustrated in FIG. 3A, the magnetic material wafer 206 has a disk shape, and a plurality of ferromagnetic materials 112 are formed on a surface thereof. The region surrounded by the dotted line FIG. 3A is an example of a region that is separated by dicing, which will be described later. However, the dicing is performed after formation of the solder balls.

FIG. 3B is a cross-sectional view seen in the Y direction in the case of cutting the magnetic material wafer 206 along line segment X1-X2 in FIG. 3A. The silicon substrate 116 in FIG. 3B corresponds to the magnetic material wafer 206 in FIG. 3A. Hereinafter, in the description of the cross-sectional view, the wafer will be referred to as a "substrate."

As illustrated in FIG. 3B, a manufacturing system forms an oxide film 160 on the surface of the silicon substrate 116 (that is, the magnetic material wafer 206), and further forms the ferromagnetic material 112 such as permalloy using a sputtering method. Further, the manufacturing system performs annealing in an environment of 400 degrees or more in order to realize high magnetic permeability. For the permalloy, for example, an alloy having a proportion of iron (Fe) of 20 percent (%) and a proportion of nickel (Ni) of 80 percent (%) is used.

Configuration Example of Image Sensor Wafer

Figure 4A:
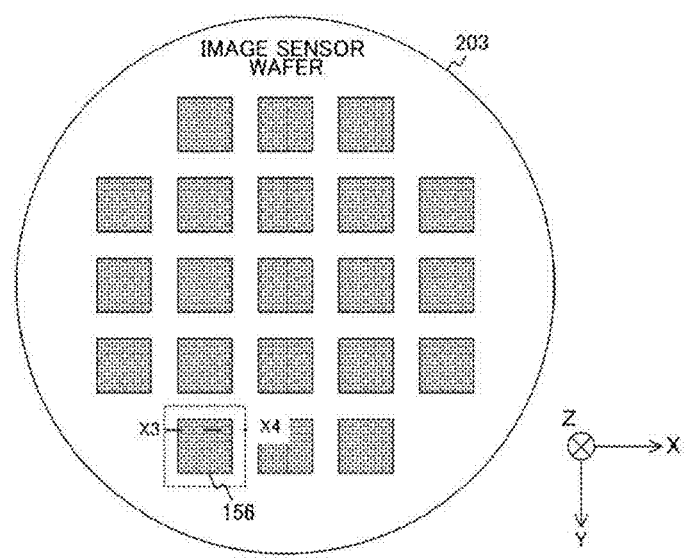
FIGS. 4A and 4B are examples of a plan view and a cross-sectional view of an image sensor wafer according to the first embodiment of the present technique.
Figure 4B:
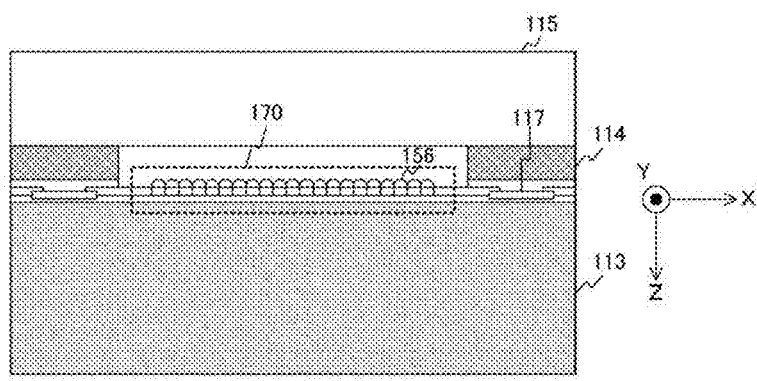

FIGS. 4A and 4B are examples of a plan view and a cross-sectional view of an image sensor wafer 203 according to the first embodiment of the present technique. FIG. 4A is an example of the plan view of the image sensor wafer 203, and FIG. 4B is an example of the cross-sectional view of the image sensor wafer 203.

As illustrated in FIG. 4A, the image sensor wafer 203 has a disk shape, and a plurality of optical film layers 156 are formed on a surface thereof. The region surrounded by the dotted line in FIG. 4A is an example of a region that is separated by dicing, which will be described later. Further, in FIG. 4A, the external connection wiring 117, the spacer resin 114, and the glass 115 are omitted for convenience of description.

FIG. 4B is a cross-sectional view seen in the Y direction in the case of cutting the image sensor wafer 203 along line segment X3-X4 in FIG. 4A. The silicon substrate 113 in FIG. 4B corresponds to the image sensor wafer 203 in FIG. 4A.

The manufacturing system forms the solid-state imaging element 170 including the optical film layer 156 on the surface of the silicon substrate 113 (that is, the image sensor wafer 203), and patterns the external connection wiring 117 and the spacer resin 114 around the solid-state imaging element 170. Then, the manufacturing system bonds the glass 115 to the image sensor wafer 203 using the spacer resin 114.

Figure 5A:
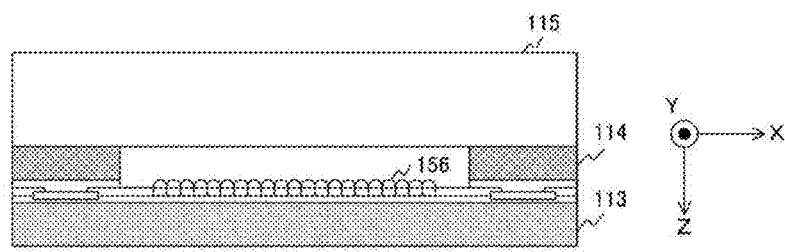
FIGS. 5A and 5B are diagrams for explaining a manufacturing process up to bonding of wafers according to the first embodiment of the present technique.
Figure 5B:
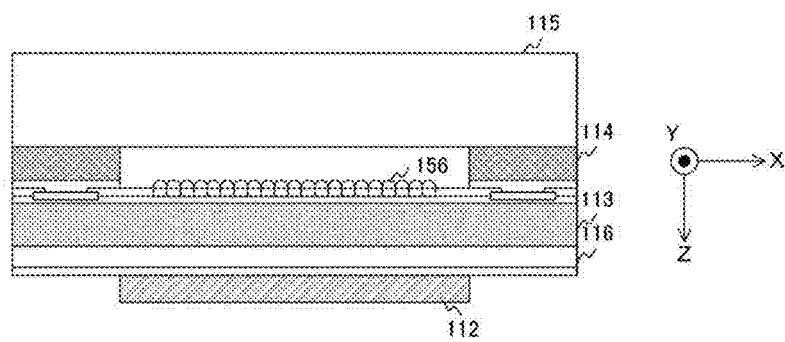

FIGS. 5A and 5B are diagrams for explaining a manufacturing process up to bonding of wafers according to the first embodiment of the present technique. FIG. 5A is a cross-sectional view for explaining a polishing process, and FIG. 5B is a cross-sectional view for explaining a wafer bonding process.

As illustrated in FIG. 5A, the manufacturing system polishes a back surface of the silicon substrate 113 (image sensor wafer 203). Here, the back surface of the image sensor wafer 203 is a surface on a side on which the solid-state imaging element 170 is not formed out of both surfaces of the image sensor wafer 203.

Next, as illustrated in FIG. 5B, the manufacturing system bonds and joins the back surface of the silicon substrate 113 (image sensor wafer 203) to a back surface of the silicon substrate 116 (magnetic material wafer 206). Here, the back surface of the magnetic material wafer 206 is a surface on a side on which the ferromagnetic material 112 is not formed out of both surfaces of the magnetic material wafer 206. Further, at the time of joining, room temperature joining is performed so that the solid-state imaging element 170 is not damaged. In the room temperature joining, the manufacturing system applies an ion beam or the like to a surface of a substrate in a high vacuum to form a dangling bond, activate it, and bond the activated surfaces together.

Figure 6A:
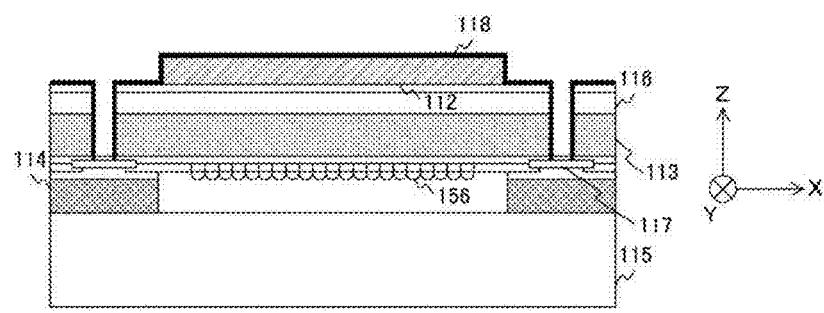
FIGS. 6A and 6B are diagrams for explaining a manufacturing process up to formation of rewiring according to the first embodiment of the present technique.
Figure 6B:
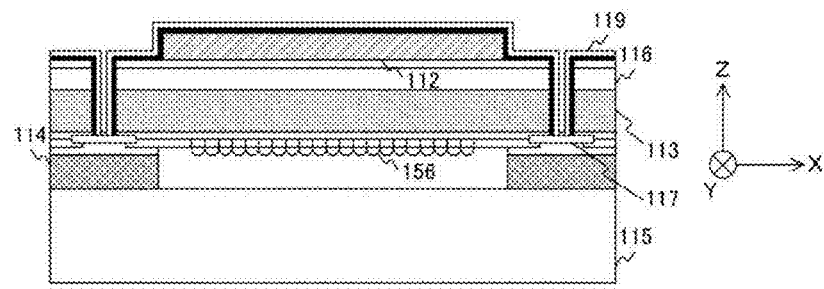

FIGS. 6A and 6B are diagrams for explaining a manufacturing process up to formation of the rewiring according to the first embodiment of the present technique. FIG. 6A is a cross-sectional view for explaining the process of forming the insulating film 118, and FIG. 6B is a cross-sectional view for explaining a patterning process of the rewiring 119.

As illustrated in FIG. 6A, the manufacturing system etches a silicon layer and an insulating layer from the silicon substrate 116 side to form through holes extending to the external connection wiring 117. Then, the manufacturing system forms the insulating film 118 on inner walls of the through holes, a surface of the ferromagnetic material 112 on the silicon substrate 116 (magnetic material wafer 206), and a periphery thereof.

Next, as illustrated in FIG. 6B, the manufacturing system patterns the rewiring 119.

Figure 7A:
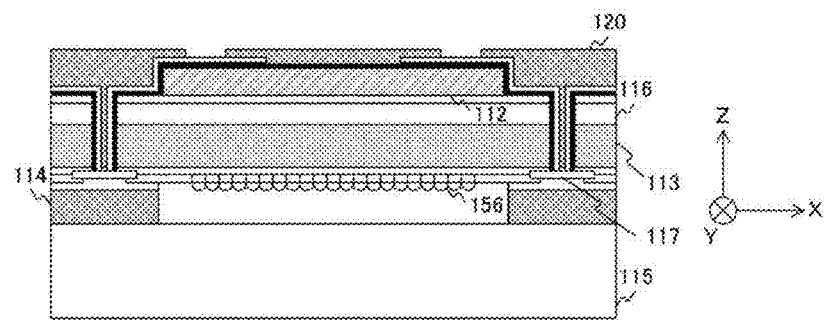
FIGS. 7A and 7B are diagrams for explaining a manufacturing process up to dicing according to the first embodiment of the present technique.
Figure 7B:
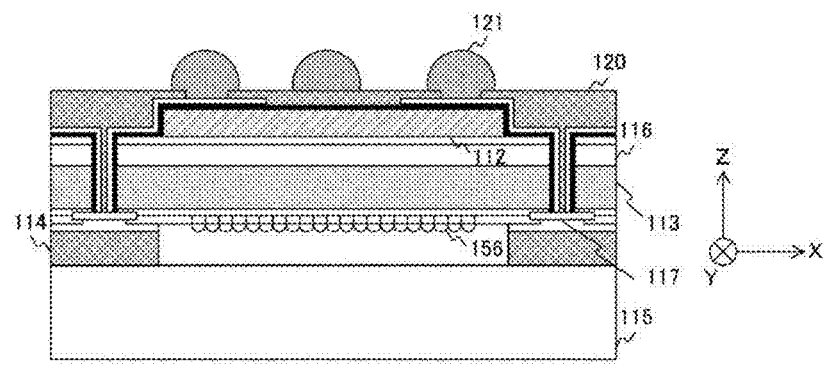

FIGS. 7A and 7B are diagrams for explaining a manufacturing process up to dicing according to the first embodiment of the present technique. FIG. 7A is a cross-sectional view for explaining a process of patterning the solder mask 120, and FIG. 7B is a cross-sectional view for explaining a process of forming and dicing the solder balls 121.

As illustrated in FIG. 7A, the manufacturing system patterns the solder mask 120 on the silicon substrate 116 (magnetic material wafer 206) side.

Next, the manufacturing system forms the solder balls 121 as illustrated in FIG. 7B and dices them into a plurality of chips to complete the wafer level package 100.

Figure 8:
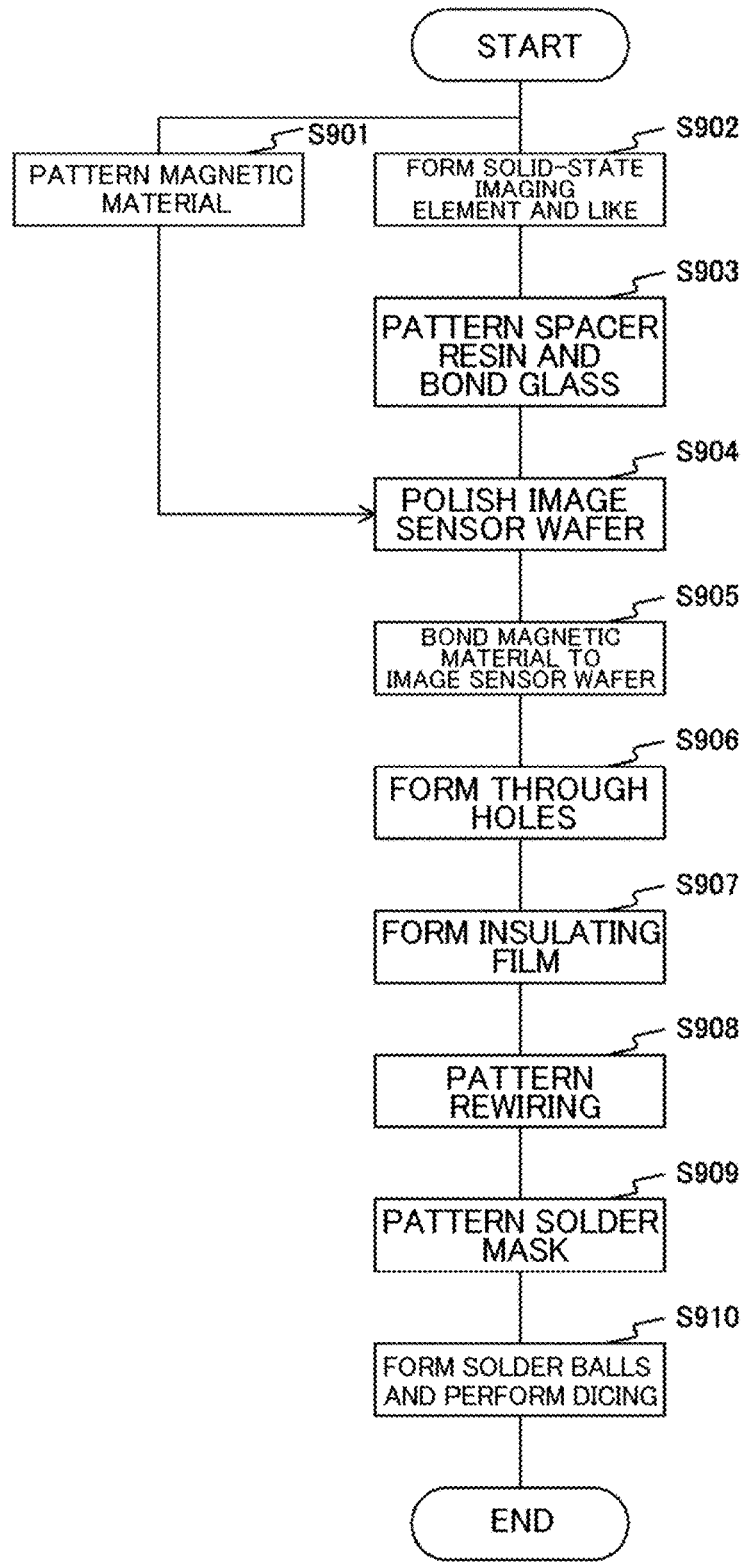
FIG. 8 is a flowchart showing an example of a method for manufacturing the wafer level package according to the first embodiment of the present technique.

FIG. 8 is a flowchart showing an example of a method for manufacturing the wafer level package 100 according to the first embodiment of the present technique. The manufacturing system patterns the ferromagnetic material 112 on the surface of the silicon substrate 116 (magnetic material wafer 206) (step S901). On the other hand, the manufacturing system forms the solid-state imaging element 170, the external connection wiring 117 and the spacer resin 114 on the surface of the silicon substrate 113 (image sensor wafer 203) (step S902) and bonds it to the glass 115 (step S903). As described above, since the solid-state imaging element 170 is formed after the film formation of the ferromagnetic material 112, the solid-state imaging element 170 (particularly, the optical film layer 156) is not damaged by high-temperature treatment during the film formation of the ferromagnetic material 112.

Subsequently, the manufacturing system polishes the back surface of the silicon substrate 113 (image sensor wafer 203) (step S904) and bonds and joins it to the silicon substrate 116 (magnetic material wafer 206) (step S905).

The manufacturing system forms the through holes by etching (step S906) and forms the insulating film 118 (step S907). Next, the manufacturing system patterns the rewiring 119 (step S908). Then, the manufacturing system patterns the solder mask 120 (step S909). Finally, the manufacturing system forms the solder balls 121 and separates them by dicing (step S910).

As described above, according to the first embodiment of the present technique, the ferromagnetic material 112 is disposed between the rewiring 119 and the solid-state imaging element 170, and thus the ferromagnetic material 112 can block the magnetic field around the rewiring 119. Thus, it is possible to inhibit electromagnetic noise due to a change in the magnetic field and prevent deterioration of image quality of image data due to the electromagnetic noise.

2. Second Embodiment

In the first embodiment described above, the image sensor wafer 203 and the magnetic material wafer 206 are bonded and joined together at room temperature, but when the room temperature joining is performed, a high degree of vacuum is generally required, which may increase manufacturing costs. A wafer level package 100 of a second embodiment is different from that of the first embodiment in that it is manufactured by a joining method other than the room temperature joining.

Figure 9:
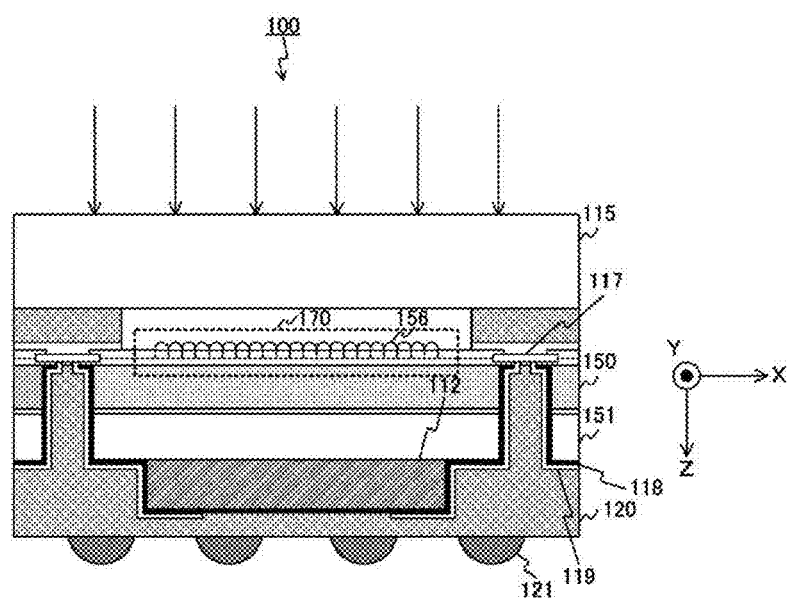
FIG. 9 is an example of a cross-sectional view of a wafer level package according to a second embodiment of the present technique.

FIG. 9 is an example of a cross-sectional view of the wafer level package 100 according to the second embodiment of the present technique. The wafer level package 100 of the second embodiment is different from the first embodiment in that a sensor circuit substrate 150 and a support substrate 151 are provided instead of the silicon substrates 113 and 116.

For the sensor circuit substrate 150, a semiconductor substrate such as a disk-shaped silicon substrate (in other words, a silicon wafer) may be used.

For the support substrate 151, a semiconductor substrate such as a silicon substrate may be used. Further, the support substrate 151 is not limited to the semiconductor substrate and may be a substrate other than the semiconductor substrate as long as it can form a ferromagnetic material.

Also, the sensor circuit substrate 150 and the support substrate 151 are examples of a pair of substrates according to the scope of the claims.

Figure 10A:
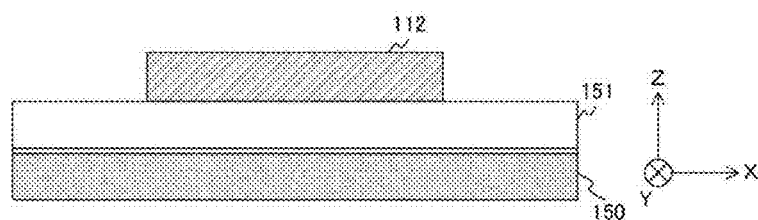
FIGS. 10A, 10B and 10C are diagrams for explaining a manufacturing process up to formation of an optical film layer according to the second embodiment of the present technique.
Figure 10B:
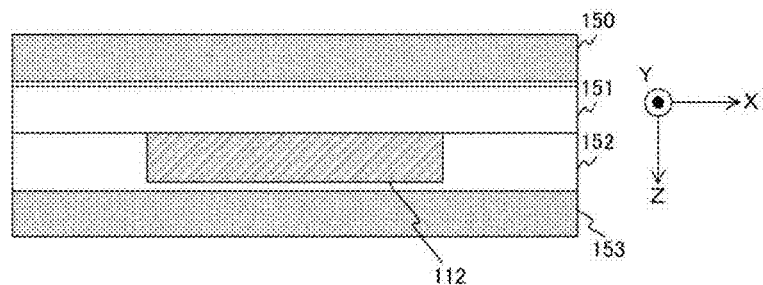
Figure 10C:
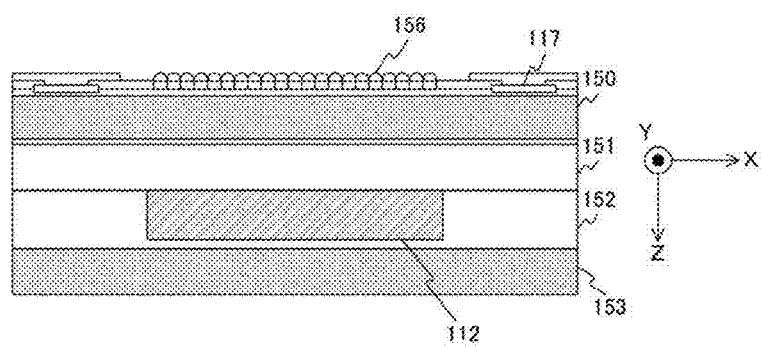

FIGS. 10A, 10B and 10C are diagrams for explaining a manufacturing process up to formation of the optical film layer 156 according to the second embodiment of the present technique. FIG. 10A is a cross-sectional view for explaining a patterning process of the ferromagnetic material 112, and FIG. 10B is a cross-sectional view for explaining a process of temporary adhesion. FIG. 10C is a cross-sectional view for explaining a process of forming the solid-state imaging element 170.

First, the manufacturing system joins the support substrate 151 to the sensor circuit substrate 150. These substrates are joined by diffusion joining, melt joining, or the like.

Then, as illustrated in FIG. 10A, the manufacturing system patterns the ferromagnetic material 112 such as permalloy on a surface of the support substrate 151 using a sputtering method and performs annealing at 400 degrees or higher.

Next, as illustrated in FIG. 10B, the manufacturing system causes a temporary substrate 153 to temporarily adhere to the support substrate 151 with a temporary adhesive 152.

Then, as illustrated in FIG. 10C, the manufacturing system forms the solid-state imaging element 170 including the optical film layer 156 on a surface of the sensor circuit substrate 150 and performs patterning of the external connection wiring 117.

As described above, the joining between the sensor circuit substrate 150 and the support substrate 151 is performed before the formation of the solid-state imaging element 170, and thus a joining other than the room temperature joining can be used for joining the substrates. Thus, it is possible to reduce the manufacturing costs.

Figure 11A:
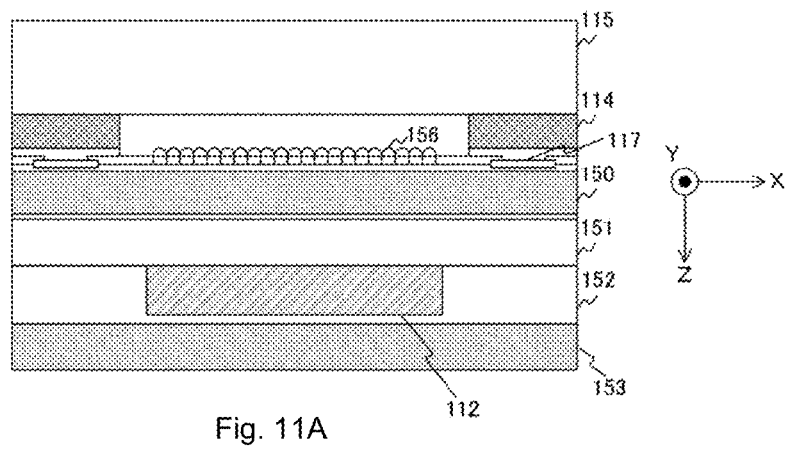
FIGS. 11A, 11B and 11C are diagrams for explaining a manufacturing process up to formation of a through hole according to the second embodiment of the present technique.
Figure 11B:
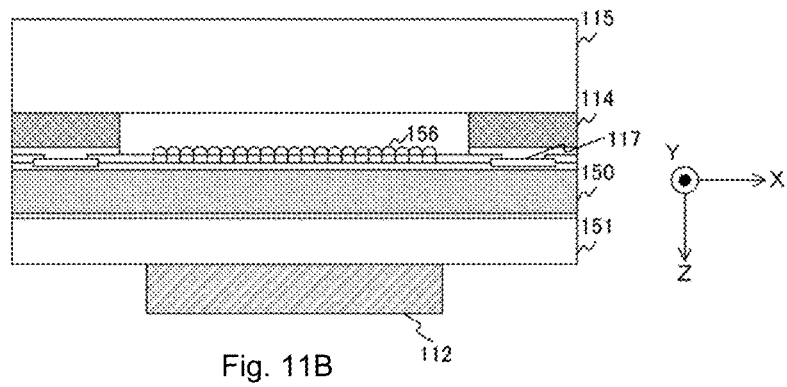
Figure 11C:
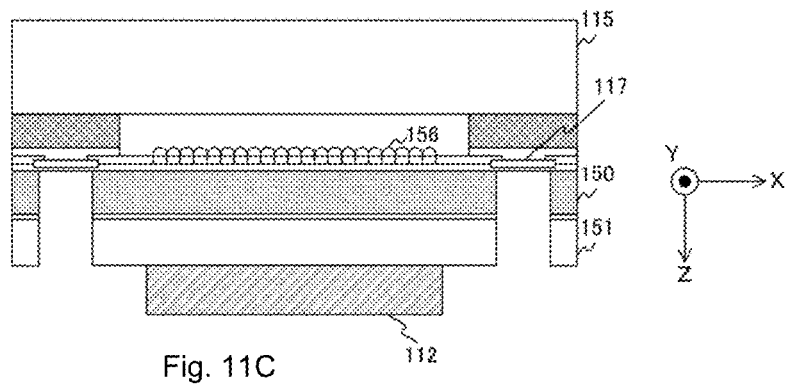

FIGS. 11A and 11B are diagrams for explaining a manufacturing process up to formation of the through holes according to the second embodiment of the present technique. FIG. 11A is a cross-sectional view for explaining a process of patterning the spacer resin 114 and bonding the glass 115. FIG. 11B is a cross-sectional view for explaining a process of removing the temporary substrate 153. FIG. 11C is a cross-sectional view for explaining a process of forming the through holes.

As illustrated in FIG. 11A, the manufacturing system patterns the spacer resin 114 around the optical film layer 156 and bonds the glass 115.

Next, as illustrated in FIG. 11B, the manufacturing system removes the temporary substrate 153. Subsequently, as illustrated in FIG. 11C, the manufacturing system etches silicon and an insulating layer from the support substrate 151 side to form the through holes penetrating to the external connection wiring 117.

Figure 12A:
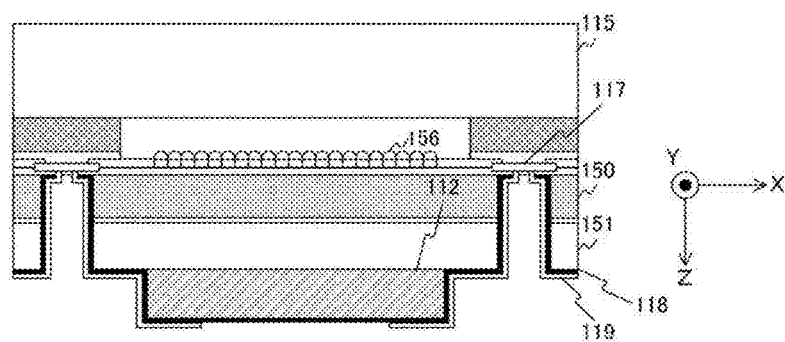
FIGS. 12A and 12B are diagrams for explaining a manufacturing process up to dicing according to the second embodiment of the present technique.
Figure 12B:
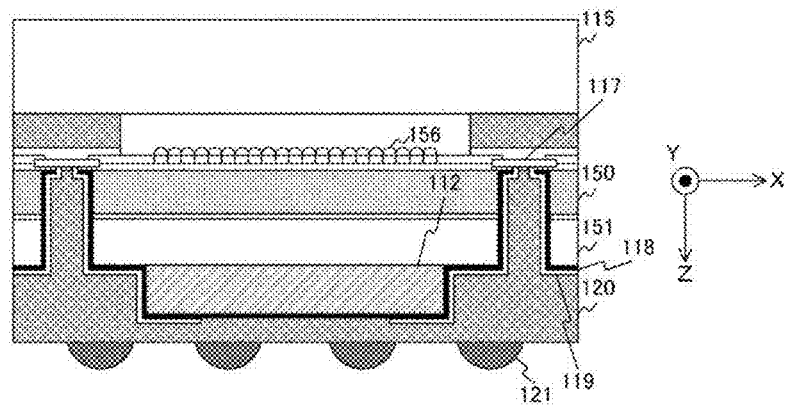

FIGS. 12A and 12B are diagrams for explaining a manufacturing process up to dicing according to the second embodiment of the present technique. FIG. 12A is a cross-sectional view for explaining a process of forming the insulating film 118 and patterning the rewiring 119. FIG. 12B is a cross-sectional view for explaining a process of forming and dicing the solder mask 120 and the solder balls 121.

As illustrated in FIG. 12A, the manufacturing system forms the insulating film 118 in the through holes and the like and patterns the rewiring 119.

Next, as illustrated in FIG. 12B, the manufacturing system patterns the solder mask 120 to form the solder balls 121. Then, the manufacturing system separates it into a plurality of chips by dicing.

Figure 13:
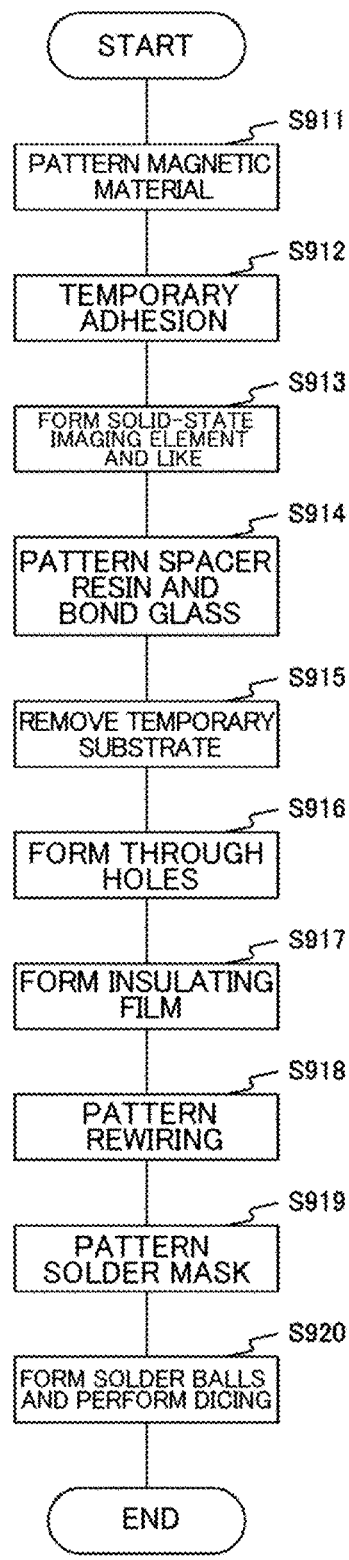
FIG. 13 is a flowchart showing an example of a method for manufacturing the wafer level package according to the second embodiment of the present technique.

FIG. 13 is a flowchart showing an example of a method for manufacturing the wafer level package 100 according to the second embodiment of the present technique.

The manufacturing system joins the sensor circuit substrate 150 and the support substrate 151 and then patterns the ferromagnetic material 112 on the surface of the support substrate 151 (step S911). Then, the manufacturing system causes the temporary substrate 153 to temporarily adhere to the support substrate 151 with the temporary adhesive 152 (step S912).

The manufacturing system forms the solid-state imaging element 170 and the external connection wiring 117 on the surface of the sensor circuit substrate 150 (step S913) and performs patterning of the spacer resin 114 and bonding of the glass 115 (step S914).

Subsequently, the manufacturing system removes the temporary substrate 153 (step S915) and forms the through holes by etching (step S916). The manufacturing system forms the insulating film 118 in the through holes or the like (step S917) and patterns the rewiring 119 (step S918). Then, the manufacturing system patterns the solder mask 120 (step S919) and dicing it into a plurality of chips (step S920).

As described above, according to the second embodiment of the present technique, since the manufacturing system forms the ferromagnetic material 112 and the solid-state imaging element 170 after the sensor circuit substrate 150 and the support substrate 151 are joined, the substrates can be joined by diffusion joining or the like. Thus, the joining can be easily performed as compared with the first embodiment in which the room temperature joining requiring a high degree of vacuum is performed.

3. Application Example to Moving Body

The technique (the present technique) according to the present disclosure can be applied to various products. For example, the technique according to the present disclosure may be realized as a device mounted on any type of moving body such as an automobile, an electric vehicle, a hybrid electric vehicle, a motorcycle, a bicycle, a personal mobility, an airplane, a drone, a ship, and a robot.

Figure 14:
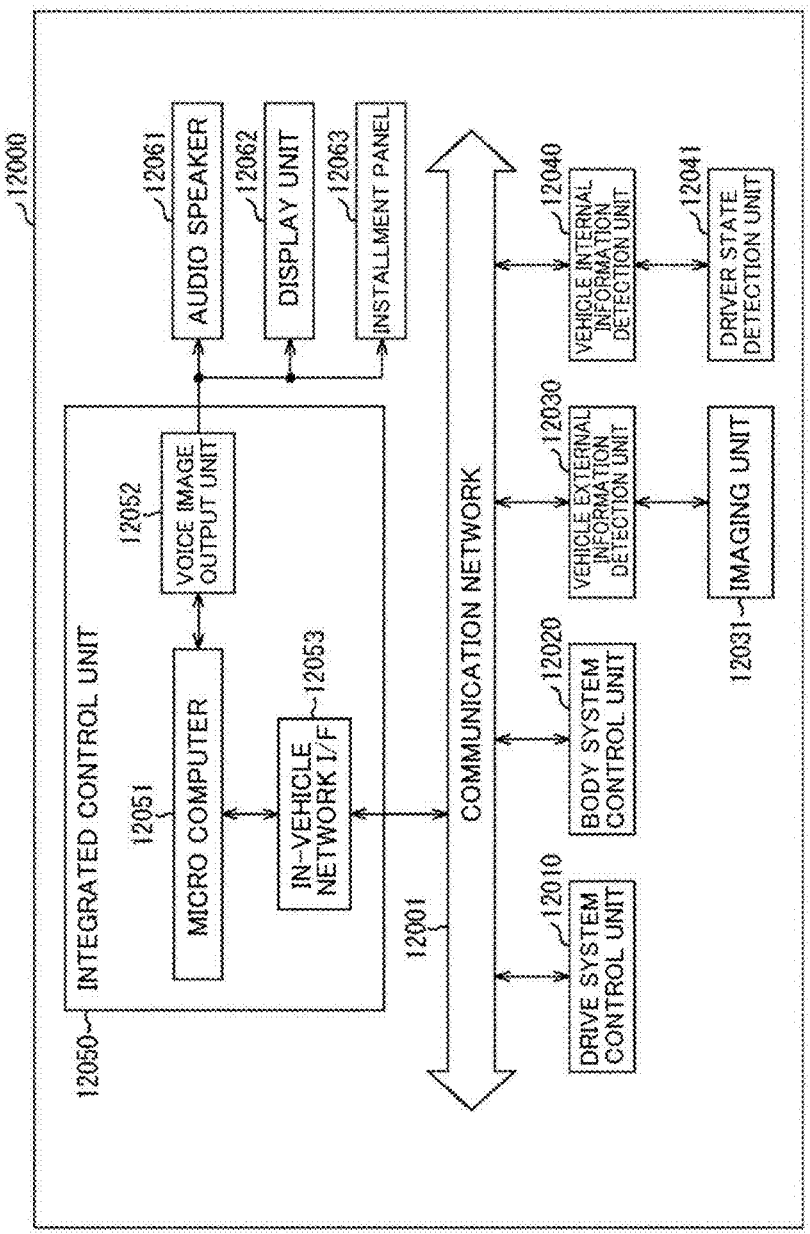
FIG. 14 is a block diagram showing a schematic configuration example of a vehicle control system.

FIG. 14 is a block diagram illustrating a schematic configuration example of a vehicle control system which is an example of a moving body control system to which the technique according to the present disclosure can be applied.

A vehicle control system 12000 includes a plurality of electronic control units connected via a communication network 12001. In the example illustrated in FIG. 14, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio/image output unit 12052, and an in-vehicle network interface (I/F) 12053 are illustrated.

The drive system control unit 12010 controls the operation of devices related to the drive system of the vehicle according to various programs. For example, the drive system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on the vehicle body according to various programs. For example, the body system control unit 12020 functions as a control device of a keyless entry system, a smart key system, a power window device, or various lamps such as a head lamp, a back lamp, a brake lamp, a blinker, or a fog lamp. In this case, radio waves transmitted from a portable device that substitutes for a key or signals of various switches can be input to the body system control unit 12020. The body system control unit 12020 receives input of these radio waves or signals, and controls a door lock device, a power window device, a lamp, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform object detection processing or distance detection processing of a person, a vehicle, an obstacle, a sign, a character on a road surface, or the like on the basis of the received image.

The imaging unit 12031 is an optical sensor that receives light and outputs an electrical signal corresponding to the amount of received light. The imaging unit 12031 can output the electrical signal as an image or can output the electrical signal as distance measurement information. Furthermore, the light received by the imaging unit 12031 may be visible light or invisible light such as infrared rays.

The vehicle interior information detection unit 12040 detects information on the inside of the vehicle. For example, a driver state detection unit 12041 that detects a driver's state is connected to the vehicle interior information detection unit 12040. The driver state detection unit 12041 includes, for example, a camera that images the driver, and the vehicle interior information detection unit 12040 may calculate the degree of fatigue or the degree of concentration of the driver or may determine whether the driver is dozing off on the basis of the detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040, and output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 can perform cooperative control for the purpose of automatic driving or the like in which the vehicle autonomously travels without depending on the operation of the driver by controlling the driving force generation device, the steering mechanism, the braking device, or the like on the basis of the information around the vehicle acquired by the vehicle exterior information detection unit 12030 or the vehicle interior information detection unit 12040.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The audio/image output unit 12052 transmits an output signal of at least one of a sound or an image to an output device capable of visually or audibly notifying an occupant of the vehicle or the outside of the vehicle of information. In the example of FIG. 14, an audio speaker 12061, a display unit 12062, and an instrument panel 12063 are illustrated as the output device. The display unit 12062 may include, for example, at least one of an on-substrate display and a head-up display.

Figure 15:
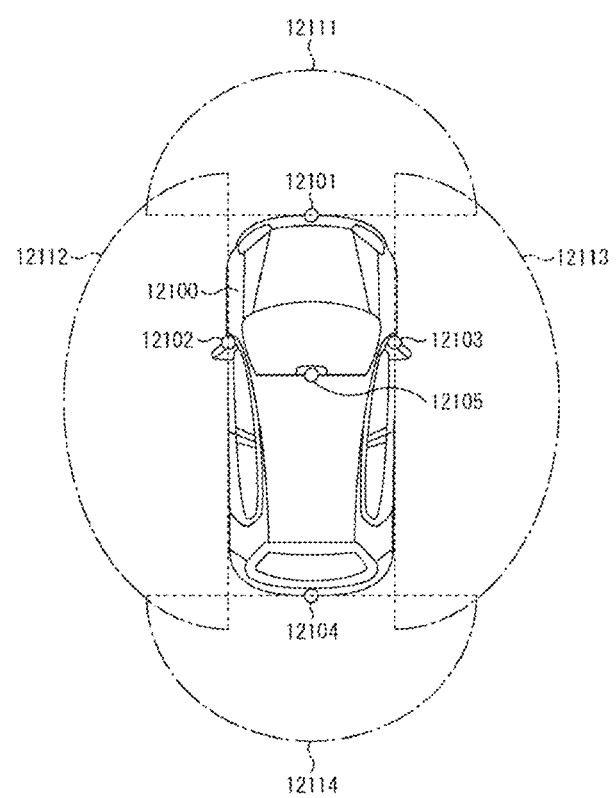
FIG. 15 is an explanatory diagram showing an example of an installation position of an imaging unit.

FIG. 15 is a diagram illustrating an example of positions at which the imaging unit 12031 is installed.

In FIG. 15, imaging units 12101, 12102, 12103, 12104, and 12105 are provided as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of the vehicle 12100. The imaging unit 12101 provided at the front nose and the imaging unit 12105 provided at the upper portion of the windshield in the vehicle interior mainly acquire images in front of the vehicle 12100. The imaging units 12102 and 12103 provided at the side mirrors mainly acquire images of the sides of the vehicle 12100. The imaging unit 12104 provided on the rear bumper or the back door mainly acquires an image behind the vehicle 12100. The front images acquired by the imaging unit 12105 is mainly used for detecting a preceding vehicle, a pedestrian, an obstacle, a traffic light, a traffic sign, a lane, or the like.

FIG. 15 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object in the imaging ranges 12111 to 12114 and a temporal change of the distance (relative speed with respect to the vehicle 12100) on the basis of the distance information obtained from the imaging units 12101 to 12104, thereby extracting, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. The microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control for the purpose of automatic driving or the like in which the vehicle autonomously travels without depending on the operation of the driver.

For example, on the basis of the distance information obtained from the imaging units 12101 to 12104, the microcomputer 12051 can classify and extract three-dimensional object data regarding three-dimensional objects into two-wheeled vehicles, ordinary vehicles, large vehicles, pedestrians, and other three-dimensional objects such as utility poles, and use the three-dimensional object data for automatic avoidance of obstacles. For example, the microcomputer 12051 identifies obstacles around the vehicle 12100 as obstacles that can be visually recognized and obstacles that are difficult to visually recognize by the driver of the vehicle 12100. The microcomputer 12051 determines a collision risk indicating a risk of collision with each obstacle, and when the collision risk is equal to or greater than a set value and there is a possibility of collision, the microcomputer 12051 can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared light. For example, the microcomputer 12051 can recognize pedestrians by determining whether there are the pedestrians in images captured by the imaging units 12101 to 12104. The pedestrians are recognized, for example, in a procedure in which feature points in the images captured by the imaging units 12101 to 12104 serving as infrared cameras are extracted and a procedure in which a pattern matching process is performed on a series of feature points indicating the contour of an object to determine whether there is a pedestrian. When the microcomputer 12051 determines that there is the pedestrian in the images captured by the imaging units 12101 to 12104 and recognizes the pedestrian, the sound and image output unit 12052 controls the display unit 12062 such that a rectangular contour line for emphasizing the recognized pedestrian is superimposed and displayed. The sound and image output unit 12052 may control the display unit 12062 such that an icon or the like indicating the pedestrian is displayed at a desired position.

The example of the vehicle control system to which the technique according to the present disclosure is applied has been described above. The technique according to the present disclosure may be applied to the imaging unit 12031 and the like among the configurations described above. Specifically, the wafer level package 100 in FIGS. 1A and 1B can be applied to the imaging unit 12031. By applying the technique according to the present disclosure to the imaging unit 12031, since a captured image that is easy to see can be obtained due to prevention of electromagnetic noise, the fatigue of a driver can be reduced.

Also, the above-described embodiments show examples for embodying the present technique, and matters in the embodiments and matters specifying the invention in the claims have a corresponding relationship with each other. Similarly, the matters specifying the invention in the claims and the matters in the embodiments of the present technique having the same name have a corresponding relationship with each other. However, the present technique is not limited to the embodiments and can be embodied by applying various modifications to the embodiments without departing from the gist thereof.

Also, the effects described in the present specification are merely examples and are not intended as limiting, and other effects may be obtained.

Further, the present technique can have the following configurations.

(1) A semiconductor package including:
   a semiconductor integrated circuit;
   wiring that connects the semiconductor integrated circuit to a predetermined external terminal; and
   a ferromagnetic material provided between the wiring and the semiconductor integrated circuit.
(2) The semiconductor package according to the above (1), wherein
   the semiconductor integrated circuit is formed on one of a pair of substrates joined together, and
   the ferromagnetic material and the wiring are formed on the other of the pair of substrates.
(3) The semiconductor package according to the above (2), wherein the wiring is formed on a surface opposite to a joining surface out of both surfaces of the pair of substrates on the other side.
(4) The semiconductor package according to any one of the above (1) to (3), wherein the semiconductor integrated circuit is a solid-state imaging element.
(5) The semiconductor package according to any one of the above (1) to (4), wherein the ferromagnetic material is permalloy.
(6) The semiconductor package according to any one of the above (1) to (5), wherein a thickness of the ferromagnet is 18 to 25 micrometers.
(7) A method for manufacturing a semiconductor package comprising:
   a ferromagnetic material forming procedure configured to form a ferromagnetic material on one of a pair of substrates;
   a circuit forming procedure configured to form a semiconductor integrated circuit on the other of the pair of substrates;
   a wiring procedure configured to form wiring connected to the semiconductor integrated circuit on a surface of the ferromagnetic material; and
   an external terminal forming procedure configured to form a predetermined external terminal connected to the wiring.
(8) The method for manufacturing a semiconductor package according to the above (7), further comprising a joining procedure configured to join the pair of substrates after the ferromagnetic material and the semiconductor integrated circuit are formed.
(9) The method for manufacturing a semiconductor package according to the above (7), wherein,
   in the ferromagnetic material forming procedure, the ferromagnetic material is formed on the one of the substrates after the pair of substrates are joined, and
   in the circuit forming procedure, the semiconductor integrated circuit is formed on the other of the substrates after the pair of substrates are joined.
(10) The method for manufacturing a semiconductor package according to any one of the above (7) to (9), wherein the ferromagnetic material forming procedure, the circuit forming procedure, the wiring procedure, and the external terminal forming procedure are performed through a wafer level process.

REFERENCE SIGNS LIST

100 Wafer level package
112 Ferromagnetic material
113, 116 Silicon substrate
114 Spacer resin
115 Glass
117 External connection wiring
118 Insulating film
119 Rewiring
120 Solder mask
121 Solder ball
150 Sensor circuit substrate
151 Support substrate
152 Temporary adhesive
153 Temporary substrate
156 Optical film layer
160 Oxide film
170 Solid-state imaging element
203 Image sensor wafer
206 Magnetic material wafer

The invention claimed is:
1. A semiconductor package, comprising:
a pair of substrates including a first substrate and a second substrate;
a semiconductor integrated circuit on the first substrate;
a wiring on the second substrate, wherein the wiring connects the semiconductor integrated circuit to an external terminal; and a ferromagnetic material on the second substrate, wherein the ferromagnetic material is between the wiring and the semiconductor integrated circuit.

2. The semiconductor package according to claim 1, wherein
the first substrate and the second substrate are joined at a joining surface, and
the wiring is on a surface of the first substrate, wherein the surface of the first substrate is opposite to the joining surface.

3. The semiconductor package according to claim 1, wherein the semiconductor integrated circuit is a solid-state imaging element.

4. The semiconductor package according to claim 1, wherein the ferromagnetic material is permalloy.

5. The semiconductor package according to claim 1, wherein a thickness of the ferromagnetic material is 18 to 25 micrometers.

6. A method for manufacturing a semiconductor package, comprising:
forming a ferromagnetic material on a first substrate of a pair of substrates;
forming a semiconductor integrated circuit on a second substrate of the pair of substrates;
forming wiring, connected to the semiconductor integrated circuit, on a surface of the ferromagnetic material; and
forming an external terminal connected to the wiring.

7. The method for manufacturing the semiconductor package according to claim 6, further comprising joining the pair of substrates after the ferromagnetic material and the semiconductor integrated circuit are formed.

8. The method for manufacturing the semiconductor package according to claim 6, wherein
the ferromagnetic material is formed after the first substrate and the second substrate are joined, and
the semiconductor integrated circuit is formed after the first substrate and the second substrate are joined.

9. The method for manufacturing the semiconductor package according to claim 6, wherein the formation of the ferromagnetic material, the semiconductor integrated circuit, the wiring, and the external terminal is executed through a wafer level process.

* * * * *